(12) United States Patent
Kamioka et al.

(10) Patent No.: US 6,339,579 B1
(45) Date of Patent: *Jan. 15, 2002

(54) SEMICONDUCTOR LASER DIODE DRIVING DEVICE AND DRIVING METHOD

(75) Inventors: Yuichi Kamioka, Osaka; Kenji Koishi, Hyogo; Yoshiyuki Miyabata; Naoyuki Nakamura, both of Kyoto; Kenichi Tatehara, Osaka; Ikuo Hidaka, Kyoto; Kiyoshi Nakamori, Osaka, all of (JP)

(73) Assignee: Matsushita Electric Industrial Co., Ltd., Osaka (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/287,338

(22) Filed: Apr. 7, 1999

(30) Foreign Application Priority Data

Apr. 9, 1998 (JP) .............................................. 10-097254

(51) Int. Cl.$^7$ ................................................. G11B 7/00
(52) U.S. Cl. ..................... 369/121; 369/59.11; 369/116
(58) Field of Search ................................. 369/116, 121, 369/59.11, 59.12

(56) References Cited

U.S. PATENT DOCUMENTS 5,138,592 A * 8/1992 Fujita ......................... 369/112

* cited by examiner

*Primary Examiner*—Nabil Hindi
(74) *Attorney, Agent, or Firm*—Wenderoth, Lind & Ponack, L.L.P.

(57) ABSTRACT

In an optical disc apparatus, a semiconductor SLD driving device is mounted on an optical pickup in order to realize a high speed switching of drive current for a semiconductor laser diode (SLD), necessary for recording data. The SLD is placed. within 5 cm from the SLD driving device. The driving device becomes a heat source due to driving current of the SLD, and increases a temperature of the optical pickup. Since the temperature rises proportionally to power consumption, power saving is required. A voltage supplied to the driving device is controlled to be a minimum level necessary for keeping the driving device still working on basic functions. The SLD driving device is mounted to the optical pickup, and this driving device handles N pieces of input signals for setting semiconductor laser power and N pieces of switch-timing-input-signals for selecting respective input signals. A supplied voltage is controlled so that a voltage supplied to the output section of the driving device is a minimum value necessary for keeping the output section still operating. A power source is placed outside of the pickup.

16 Claims, 10 Drawing Sheets

FIG. 1
RECORDED MARK
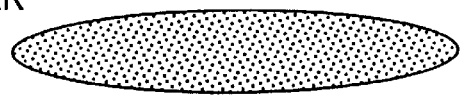
RECORDING PULSE
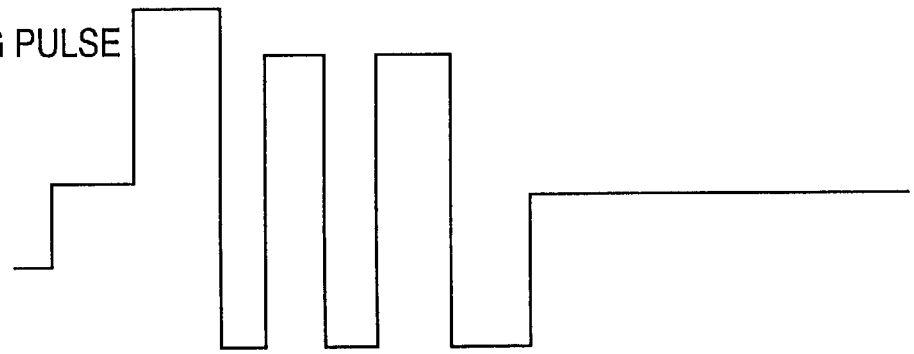
FIG. 2
RECORDED MARK
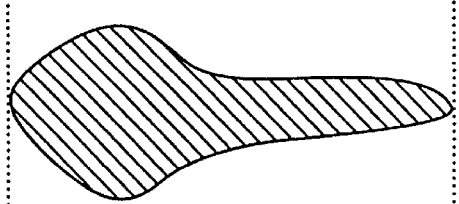
RECORDING PULSE
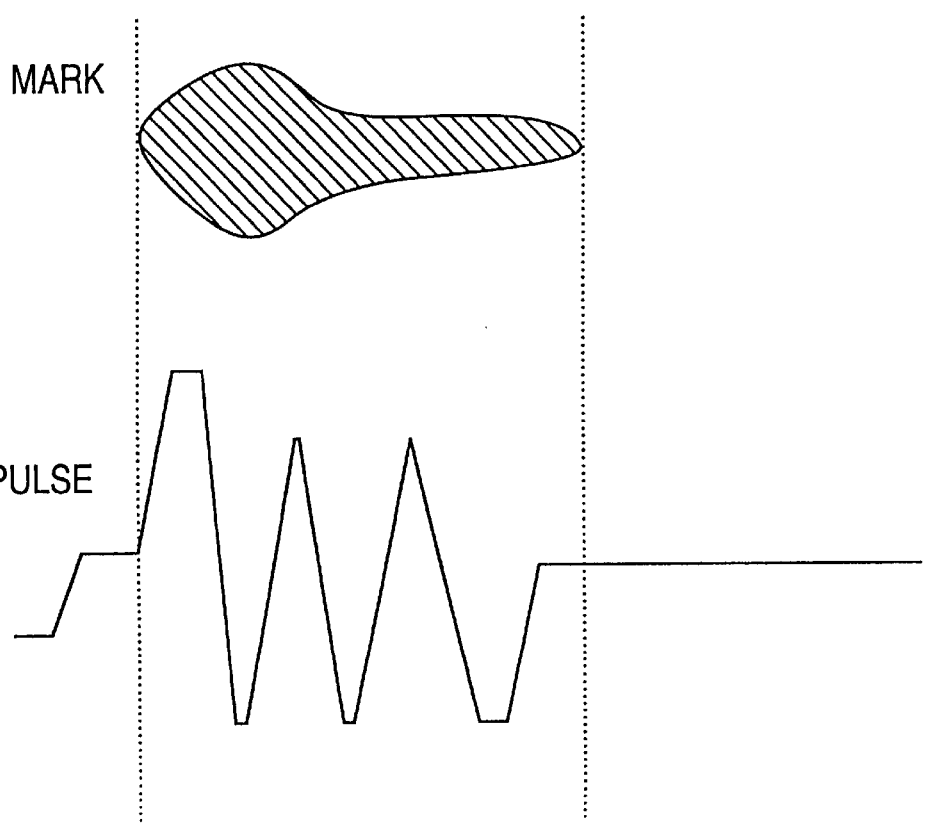

SEMICONDUCTOR LASER DIODE DRIVING DEVICE AND DRIVING METHOD

FIELD OF THE INVENTION

The present invention relates to controlling a semiconductor laser diode mounted to optical pickups of optical disc apparatuses.

BACKGROUND OF THE INVENTION

A semiconductor laser diode (hereinafter referred to as SLD) emits light for recording and reproducing information. The SLD is mounted to an optical pickup of an optical disc apparatus. When reproducing information, the apparatus converges reproduced weak light onto a disc so that reflectance, phase difference and deflection angle of a pit recorded on the disc can be detected for reading the information. When recording information, the SLD emits light with a higher power than in reproducing, and the laser power is modulated responsive to the information to be recorded on the disc. When erasing information, the apparatus irradiates laser power, slightly weaker than recording power, onto the disc to erase the information.

For instance, when recording information into a phase change optical disc, the apparatus switches binary values of a laser power, i.e., basically, recording a mark by peak power, and erasing the recorded mark by bias power.

This switching of binary values of laser powers, however, is actually not enough to form a stable recorded mark. As shown in FIG. 1, switching a plurality of laser powers, namely more than two values, is required in order to uniform amounts of heat applied to marks to be recorded, and to adjust heat balance at a leading edge and an tailing edge of the mark.

Recently, the market has required a higher speed of recording and reproducing to/from optical discs, which entails a higher speed of switching the laser power.

When a recording pulse shown in FIG. 1 is tried to be realized in a high speed recording mode, laser power could not reach a desirable wave height shown in FIG. 2 in a case where a pulse waveform of a SLD was not sufficiently increased in speed. As a result, unbalanced heat is applied to a recorded mark, which distorts the recorded mark.

In the PWM (pulse width modulation) signal recording which has information at a leading and a tailing edges of a recorded mark, the edge position of the recorded mark needs to be accurately controlled. Therefore, a record pulse with shorter rising and falling times is required.

In a conventional system where an optical pickup including a SLD is separated from a driving device of the SLD, a driving current of the SLD is normally transmitted via flexible cable or the like. In this case, distributed constants of the flexible cable, such as parasitic capacity, degrade switching characteristics of the driving current. In other words, the degradation of switching characteristics obstructs the speedup of the optical disc apparatus.

SUMMARY OF THE INVENTION

The present invention aims to improve the disadvantage discussed above, and solve the resultant problem in due course, i.e. heat concentration, by saving power.

FIG. 3 shows a relation of a parasitic capacitance component of conductive bodies between the laser diode driving device and the SLD to Tr, Tf (rising time and falling time) of a SLD driving current when the SLD is switched pulse-wise.

FIG. 3 proves that Tr and Tf increase at a greater capacitance component, because the high frequency component of the transmitted pulse current is bypassed via the capacitance before reaching the SLD. The pulse waveform thus becomes dull as shown in FIG. 2.

Assume that a pulse of a maximum frequency "f1" is required to drive the SLD, a minimum pulse width should be 0.5/f1. Accordingly, a condition of no decrease in the amplitude of driving SLD is achieved by the following expression:

$$Tr < 0.5 \times 0.5/f1, \quad Tf < 0.5 \times 0.5/f1 \qquad \text{Expression 1}$$

For instance, to realize a pulse switching of 60 MHz=max. frequency, Expression 1 requires both of Tr and Tf be not more than 4.16 ns. The experiment result shown in FIG. 3 tells that a parasitic capacitance component should be not more than 10 pF in order to realize Tr, Tf<4.16 ns. To satisfy this condition, shortening the distance between the SLD and the laser diode driving device within 5 cm is required.

In order to realize a high speed laser diode current switching, the laser diode driving device and the SLD are desirably placed closer with each other so that the distributed constants therebetween, in particular, parasitic capacitance can be decreased. In other words, the laser diode driving device should be mounted on the optical pickup that incorporates the SLD, or the SLD driving device should be attached to a moving section where the optical pickup is disposed.

In this case, heat generated in the SLD and in the laser diode driving device causes a problem. During the recording mode onto a disc, SLD driving current "Iop" reaches several hundreds mA, and a temperature rise Td in the driving device is calculated by the following equation:

$$Td = K1 \times Vd \times Iop \qquad \text{Expression 2}$$

where:
Td=temperature rise in SLD driving device,
Vd=voltage across an output section of the driving device, and
K1=proportionality constant Since the SLD driving device and the SLD should be placed closely with each other in order to decrease the influence of the distributed constants including the parasitic capacitance, the heat generated in the driving device travels to the SLD.

Driving characteristics of SLD largely depend on a temperature. The relation of light emission power of laser to the driving current "Iop" degrades at higher temperature; i.e. differential efficiency is degraded. A greater driving current is thus required at a higher temperature, which accelerates temperature rise in the driving device according to Expression 1.

The SLD per se is a heat source, and its temperature rise "Tld" is expressed by the following equation:

$$Tld = K2 \times Vop \times Iop \qquad \text{Expression 3}$$

where:
Vop=operational voltage of the SLD,
K2=proportionality constant.

Assume that heat conductivity from the driving circuit to the SLD is set as K3, a temperature rise of the SLD is expressed by the following equation:

$$Tld = K2 \times Vop \times Iop + K3 \times K1 \times Vd \times Iop \qquad \text{Expression 4}$$

The heat problem discussed above may be solved by the following measures:

1. Restraining the driving current "Iop",
2. Restraining proportionality constants K1, K2 and heat conductivity K3, and
3. Restraining voltages Vd applied across the output section of the driving device and Vop.

"Iop" is a characteristic proper to SLDs. Constants K1, K2 and K3 are dependent on constructions of optical pickups and heat mechanical designs. "Vop" also follows the driving current "Iop". A change amount of "Vop" is dependent on a diode voltage and inner series resistors, which is basically a value proper to SLDs. Therefore, the voltage "Vd" across the output section of the SLD driving device is restrained so that the heat generation at the pickup can be restrained.

The following measures are taken to restrain "Vd": A power supply is provided so that a voltage supplied to the output section of the SLD driving device can be controlled, and the voltage at the output section can be monitored. The voltage is compared with a reference voltage, and the deference is fed back to the power supply so that "Vd" can be always maintained at a constant level. Further, a voltage of the power supply is set at a minimum value within the driving range which still keeps the output section working.

The power supply discussed above is set at a place other than the optical pickup; i.e. a surplus heat source is isolated to a place where no thermal influence is effected to the SLD.

Further, even if drift of an ac line voltage, load drift or other variations would change the DC source voltage of the optical disc apparatus, the "Vd" of the output section of the SLD driving device is kept at a constant level. The heat generated in the optical pickup thus is not affected by the changes of the line voltage of the apparatus.

As such, the voltage "Vd" across the output section of the SLD driving device is kept at a lowest possible value for operation so that a thermal rising value in the pickup can be minimized. As a result, a high speed and stable SLD driving device can be realized.

BRIEF DESCRIPTION OF THE DRAWINGS

FIG. 1 illustrates a recording pulse waveform and a recorded mark.

FIG. 2 illustrates a waveform having a lowered amplitude due to a dull pulse, and a resultant recorded mark.

DESCRIPTION OF THE PREFERRED EMBODIMENTS

Figure 3:
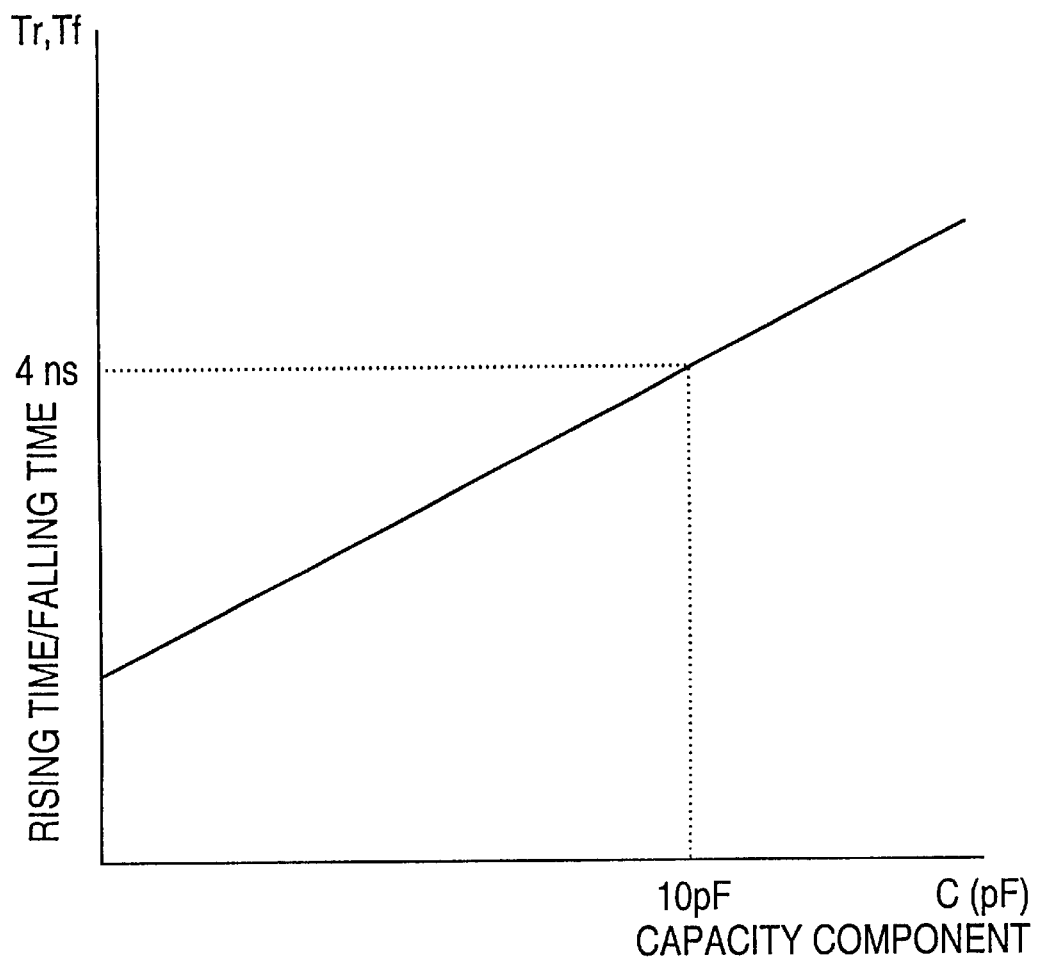
FIG. 3 is a graph showing a relation of parasitic capacitance in a conductive body between a SLD and a SLD driving device vs. Tr (rising time) and Tf (falling time) of a pulse waveform.
Figure 4:
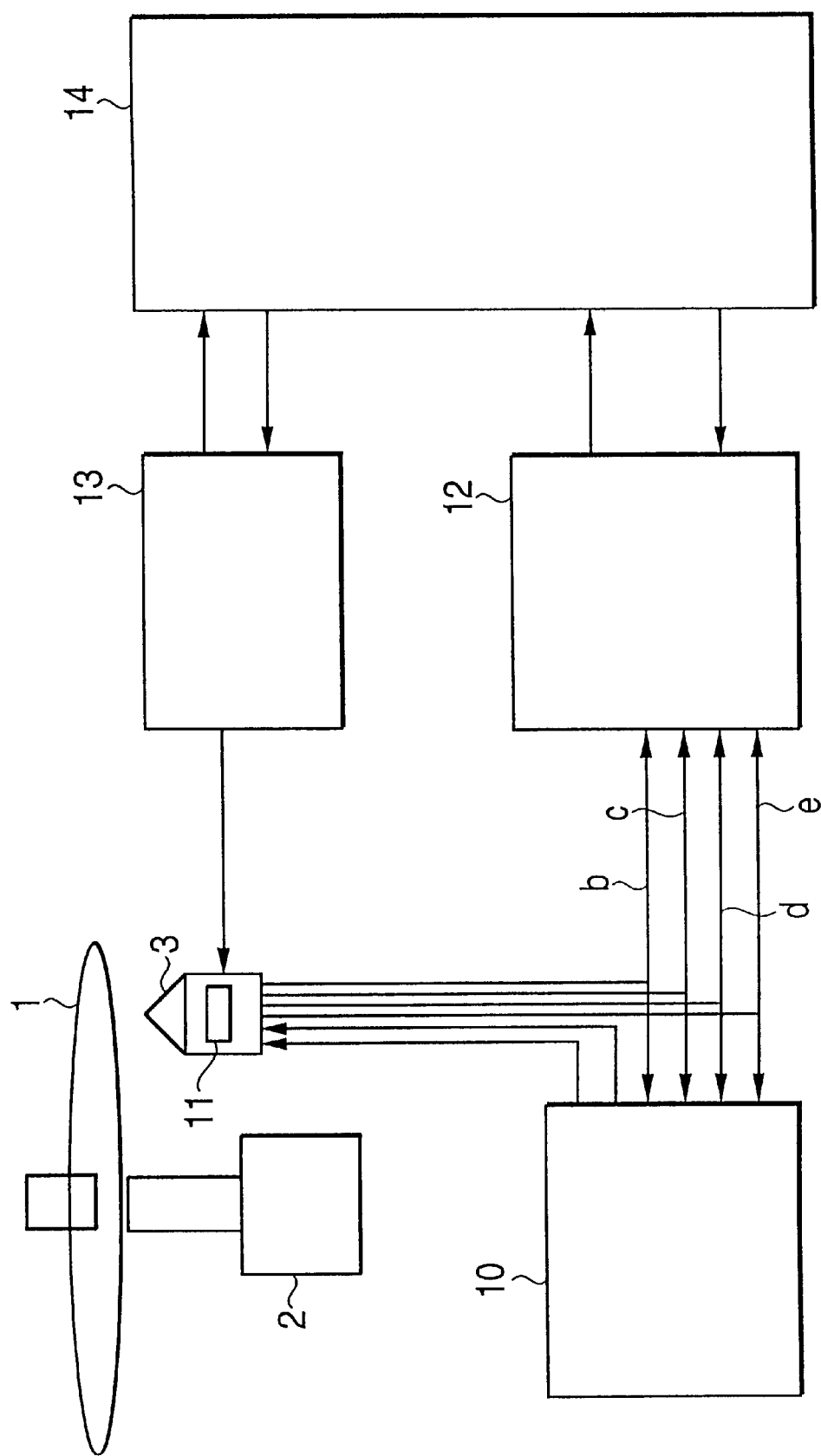
FIG. 4 is a block diagram of an optical disc system.

FIG. 4 is a system block diagram of an optical disc recording and reproducing apparatus. Optical disc 1 is spun in a given direction by spindle motor 2. Optical pickup 3 records/reproduces data to/from the optical disc 1.

Figure 5:
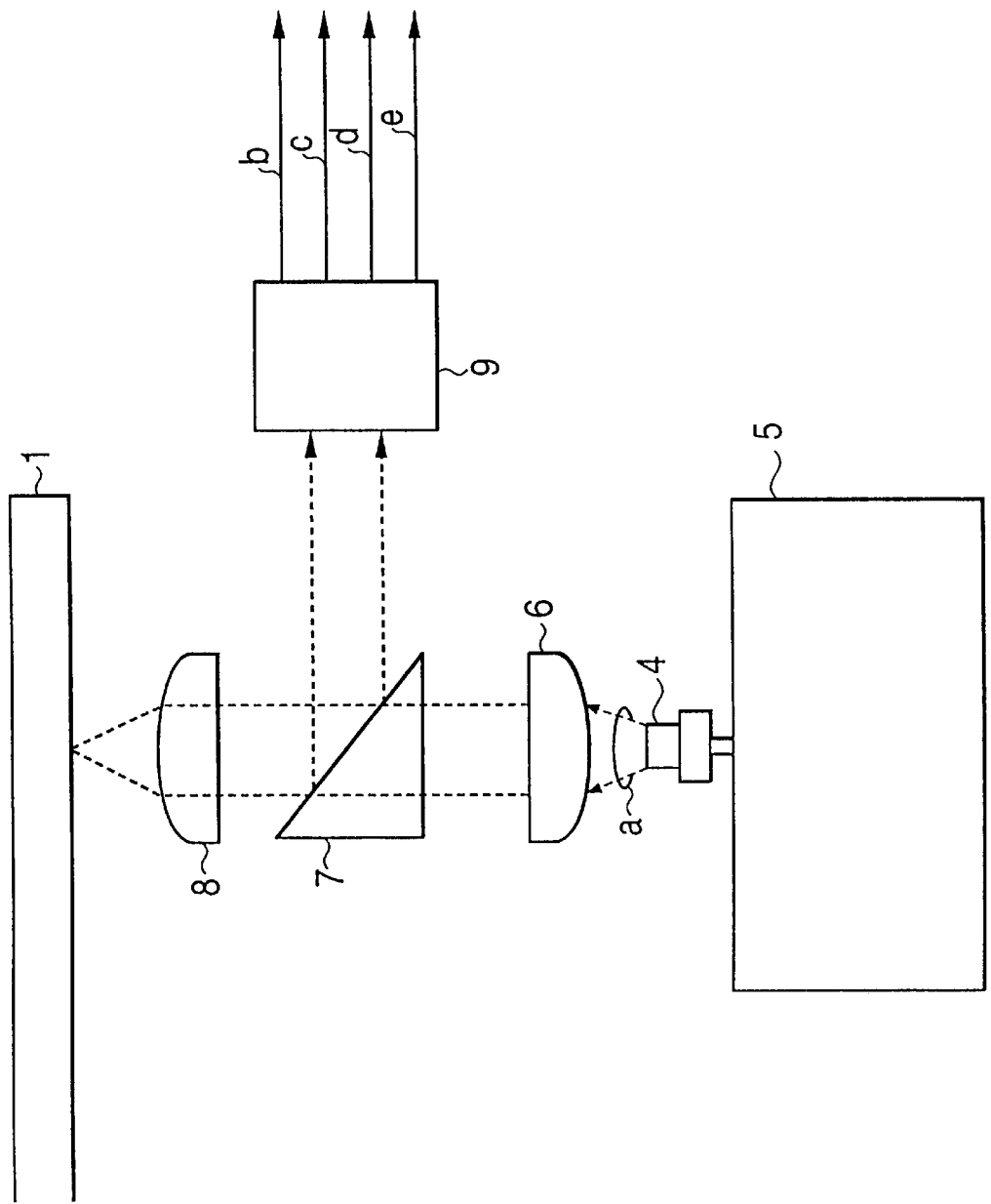
FIG. 5 is a block diagram of an optical pickup.

FIG. 5 is block diagram of the optical pickup 3, and the diagram includes a SLD driving device 5. SLD 4 outputs laser beam "a" by driving current "Iop" supplied by the SLD driving device 5. The laser beam "a" irradiated from SLD 4 is collimated by lens 6, and runs through beam splitter 7, and then enters to object lens 8. The laser beam converged by object lens 8 is focused to a spot on a data recording face of optical disc 1. The laser beam reflected by the recording face is collimated again by object lens 8, has its route changed by the beam splitter 7 and finally converged into photo detector 9.

Photo detector 9 converts the beam reflected by optical disc 1 into an electric signal, which is fed into servo block 10 as shown in FIG. 4. Focusing and tracking are controlled in response to the electric signal from photo detector 9. Focus signal (+), focus signal (−), tracking signal (+) and tracking signal (−) represented by "b", "c", "d" and "e" respectively in FIG. 4 and FIG. 5 are fed into servo block 10. In block 10, a focus error signal is produced from the focus signals (+) and (−), and a tracking error signal is produced from the tracking signals (+) and (−).

The focus error signal and the tracking error signal are amplified in current, and then transmitted to actuator 11 of optical pickup 3. Actuator 11 is controlled so that outgoing beam from optical pickup 3 is converged onto the recording face of optical disc 1.

The focus signal and the tracking signal supplied from photo detector 9 are fed into reproduced signal processing block 12, and high frequency signal components of these signals are detected as information data recorded by pits on the optical disc 1.

Recording signal processing block 13 modulates incoming data for an optical disc, changes a format, and controls laser power as well as timing which will be discussed later.

Main control block 14 controls recording signal processing block 13 and reproduced signal processing block 12.

Figure 6:
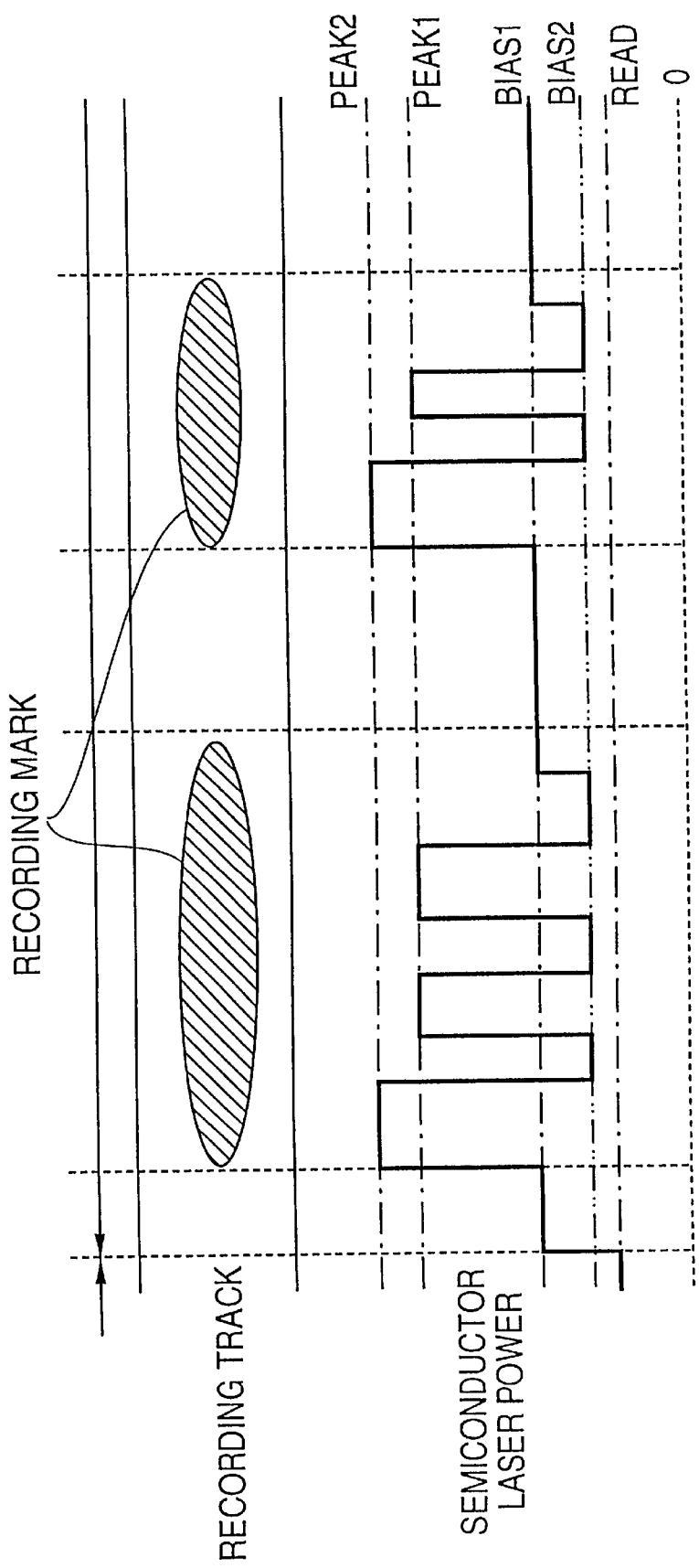
FIG. 6 illustrates laser power and the corresponding recorded marks on an optical disc.

FIG. 6 shows laser power and the corresponding recorded marks on a phase-change-optical-disc as an example. Peak power 1 (PEAK 1) and peak power 2 (PEAK 2) are used for forming recorded marks on optical disc 1. Bias power 1 (BIAS 1) is used for erasing a mark recorded on the disc. Bias power 2 (BIAS 2) is used for reducing amount of heat stored in the mark.

Reproducing power (READ) is always in ON status except during recording periods.

As discussed above, this embodiment requires five values of laser power for recording/reproducing data to/from the optical disc.

Figure 7:
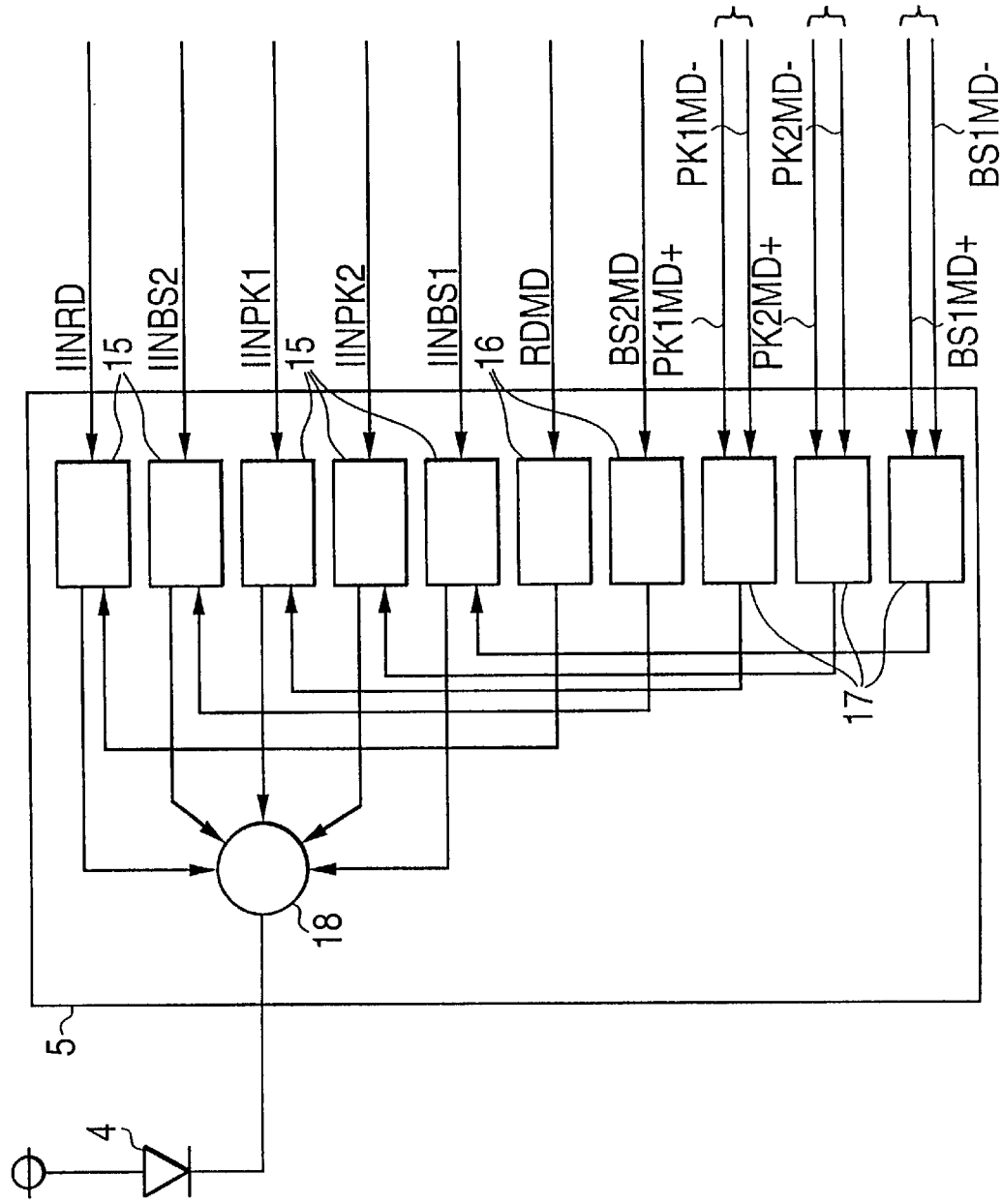
FIG. 7 illustrates a block diagram of a SLD driving device.

FIG. 7 is a block diagram of a SLD driving device. Reproducing power setting current input (IINRD), peak power 1 setting current input (IINPK1), peak power 2 setting current input (IINPK2), bias power 1 setting current input (IINBS1), and bias power 2 setting current input (IINBS2) are independently applied to current input buffers 15 (signal input section) from recording signal processing block 13. A power setting signal is represented by current input so that impedance on a transmitting route can be reduced. Therefore, influence by noises in a long transmission line such as flexible cable can be minimized. The aforementioned five inputs may be also supplied by voltage input.

A timing signal comprises the following five signals:
(1) reproducing power timing signal (RDMD),
(2) peak power 1 timing signal (PK1MD+, PK1MD−),
(3) peak power 2 timing signal (PK2MD+, PK2MD−),
(4) bias power 1 timing signal (BS1MD+, BS1MD−), and
(5) bias power 2 timing signal (BS2MD+, BS2MD−).

Power timing signals function as enable signals for the power setting currents input fed into buffers 15 in the SLD driving device.

Figure 8:
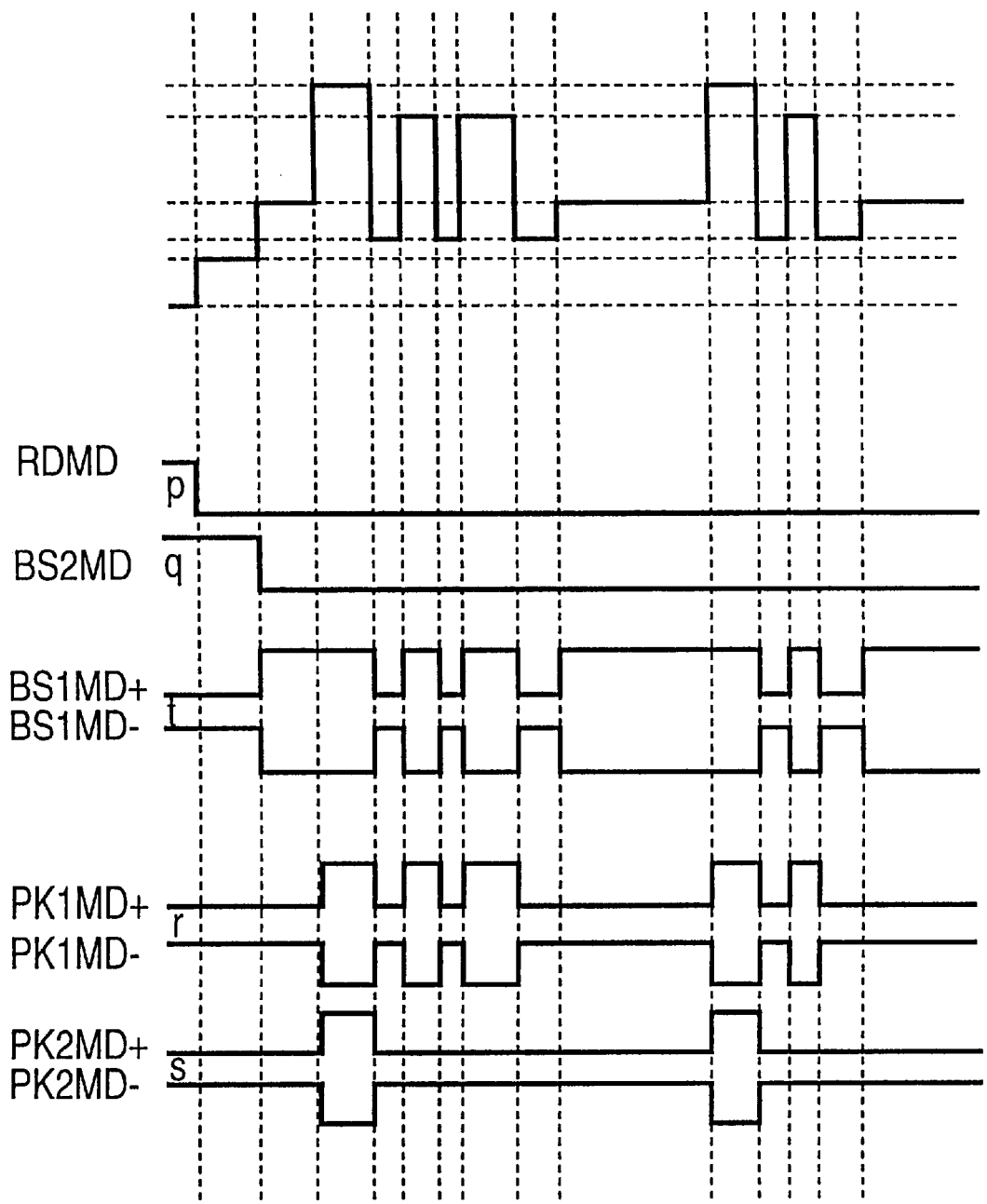
FIG. 8 illustrates timing signals and the corresponding laser power.

FIG. 8 is a timing chart of the timing signals for realizing the laser beam shown in FIG. 6. Reproducing power timing signal (RDMD) stays always active status while beam is at reproducing power. Bias power 2 timing signal (BS2MD) stays stays always active at the recording and erasing periods. These two signals do not need high speed switching. Therefore, regarding the two timing signals discussed above, single end transmission method is employed, and the signals are fed into single end logic input sections 16 (part of a timing signal input section). In FIG. 8, an active status of BS2MD signal is L level.

As shown in FIG. 8, Peak power 1 timing signal (PK1MD), peak power 2 timing signal (PK2MD) and bias power 1 timing signal (BS1MD) require high speed switching when recorded marks are formed. These three are differential signals and are fed into an input section 17 of (part of the timing signal input section) differential logic shown in FIG. 7. These three timing signals which are fed into the logic and undergo calculations are defined as follows:

$$PK1MD = (PK1MD+) - (PK1MD-) \quad \text{Expression 5}$$

$$PK2MD = (PK2MD+) - (PK2MD-) \quad \text{Expression 6}$$

$$BS1MD = (BS1MD+) - (BS1MD-) \quad \text{Expression 7}$$

In the case of PK1MD shown in FIG. 8 as an example, when PK1MD+ is at H level and PK1MD− is at L level, PK1MD is in an active status. Since data are transmitted in the differential manner, invaded noise components can be cancelled in a long transmission line such as the flexible cable. An edge position of the calculations comes to a crossing point of a positive logic input and a negative logic input. Therefore, if voltage changes or noises cause a change in duty, less influence is effected to the duty after a final differential calculation. Duty preservative of recording pulses in the optical disc recording system, which employs PWM recording method, is a key function because information is stored in a length of the recorded mark.

Based on the definition discussed above, the relations between each timing line and "Iop" are expressed below:

$$Iop = G \times (RDMD \times IINRD + \quad \text{Expression 8}$$
$$PK1MD \times IINPK1 +$$
$$PK2MD \times IINPK2 +$$
$$BS1MD \times IINBS1 +$$
$$BS2MD \times IINBS2)$$

where G=gain of the SLD driving device output section 18 shown in FIG. 7.

As such, in the recording and erasing operations, which require high speed in control timings, a two-signal-differential method is provided in the control timing signals so that withstand strength against noises is boosted, thereby increasing accuracy of controlling the timings. Further, an adding method is employed in producing the SLD driving signals so that distributed smaller currents of each element can be dealt with, which gives advantages for reducing heat amount in buffers 15, 16 and 17 as well as for the switching characteristics.

Figure 9:
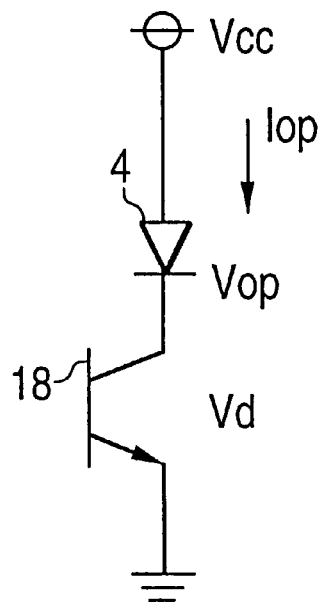
FIG. 9 is a circuit diagram of an output section of the SLD driving device.
Figure 10:
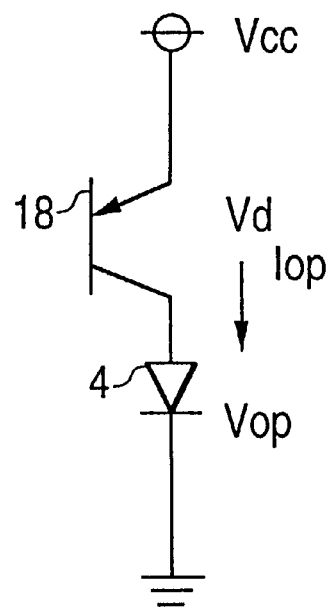
FIG. 10 is a circuit diagram of the output section of the SLD driving device.

FIG. 9 and FIG. 10 show a simplified structure of output section 18 of the SLD driving device.

FIG. 9 illustrates a method which supplies driving current "Iop" in a direction pulling out from a cathode side of SLD 4, while FIG. 10 illustrates a method which supplies driving current "Iop" in a direction pouring into an anode side of SLD 4. SLD driving current "Iop" amounts to in the order of several hundreds mA, and more than half of the power consumed on the optical pickup is generated by laser driving current "Iop". The power consumption "P" on the optical pickup is expressed as follows:

$$P = VCC \times Iop \quad \text{Expression 9}$$

where VCC=DC source voltage.

When the VCC varies toward the maximum value, P takes maximum value. The VCC, as shown in FIG. 9, comprises Vop=a working voltage of SLD 4 and Vd=a working voltage of SLD driving device output section 18. The VCC thus can be expressed as follows:

$$VCC = Vop + Vd \quad \text{Expression 10}$$

Figure 11:
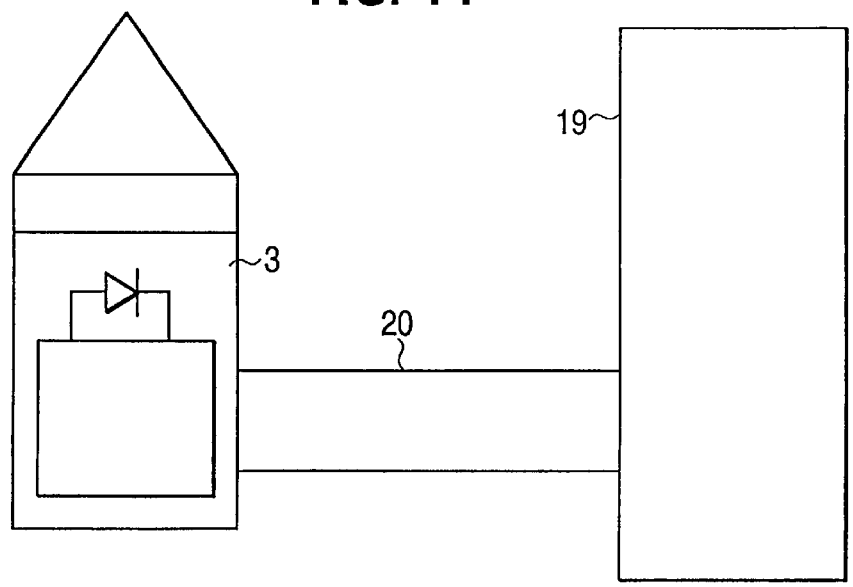
FIG. 11 illustrates a location of an optical head.

As shown in FIG. 11, the VCC is supplied from main section 19 through flexible cable 20 in general. Some voltage decrease can occur on the flexible cable: However, it is omitted to simplify this description. Main section 19 is equipped with reproduced signal processing block 12, recording signal processing block 13, a control block and the like.

The working voltage Vop of SLD 4 does not stay constant but changes responsive to the working current Iop.

In general, the following expression 11 can be established:

$$Vop = V1d + Iop \times Rs \quad \text{Expression 11}$$

where
V1d=diode voltage in the SLD, and
Rs=inner resistance. Then, Expression 9 can be rewritten as follows:

$$P = (Vop + Vd) \times Iop \quad \text{Expression 12}$$
$$= (V1d + Iop \times Rs + Vd) \times Iop \quad \text{Expression 13}$$

Figure 12:
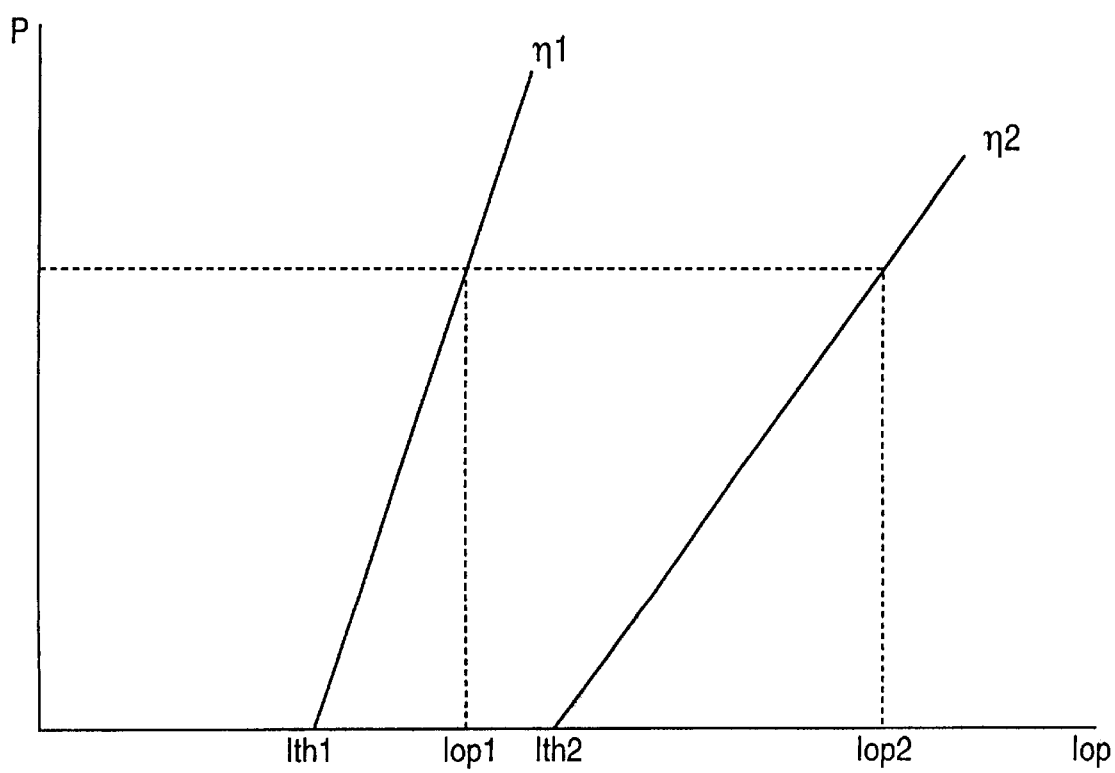
FIG. 12 illustrates relations of SLD output power vs. driving current.

FIG. 12 shows relations of output laser power of SLD 4 to the driving current "Iop". The SLD outputs a beam of light proportional to the driving current "Iop" with a slant of differential efficiency η with regard to the current exceeding a threshold current "Ith". This characteristic of SLD depends on an environmental temperature and deterioration of the SLD due to long-hour use. The graph of "Ith1" and its slope "η1" shows the relation of an output laser power to the driving current, both are at a room temperature and at an initial status of the service life time. The graph shifts to the graph of "Ith2" and its slope "η2" at a high temperature or after long-hour use. In other words, the driving current necessary to output a constant laser power P1 is "Iop1" for the first case and "Iop2" for the second case, where Iop1<Iop2. Heating amount of the SLD driving device 5 increases at a greater driving current Iop according to Expressions 2, 3 and 4, which increases a temperature of SLD 4. A higher temperature requires a greater driving current Iop, which would cause a vicious spiral. Saving power in the optical pickup is thus a crucial subject to be achieved. Expressions 9 and 13 tell that decreasing the driving current Iop is effective to save power of the optical pickup; however, the driving current, temperature characteristics and deterioration with time largely depend on the SLD per se, and these factors are hard to control.

The VCC is controlled according to Expression 9, i.e. the voltage Vd across the output section of the SLD driving device is controlled, thereby realizing the power saving.

Figure 13:
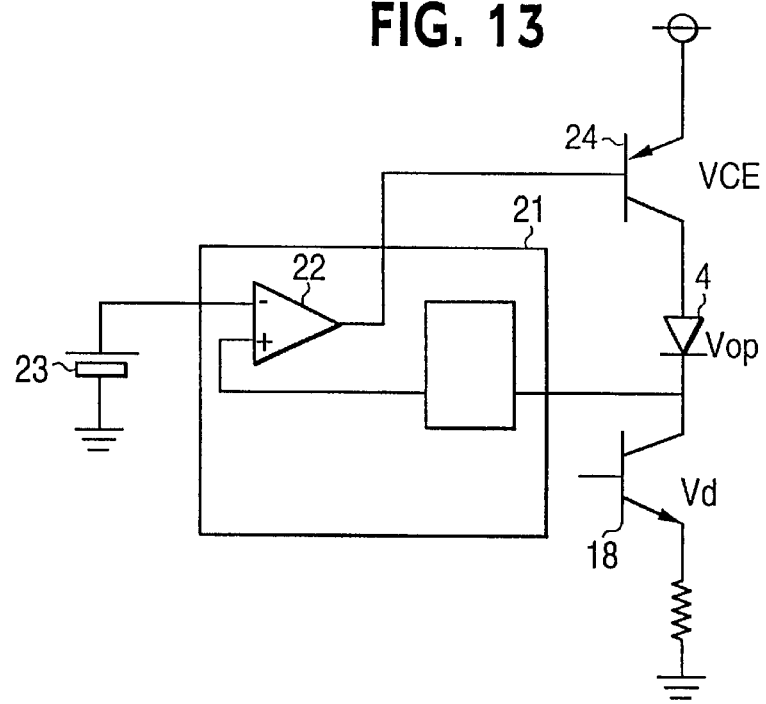
FIG. 13 is a circuit diagram of an output section of a power-saving SLD driving device.
Figure 14:
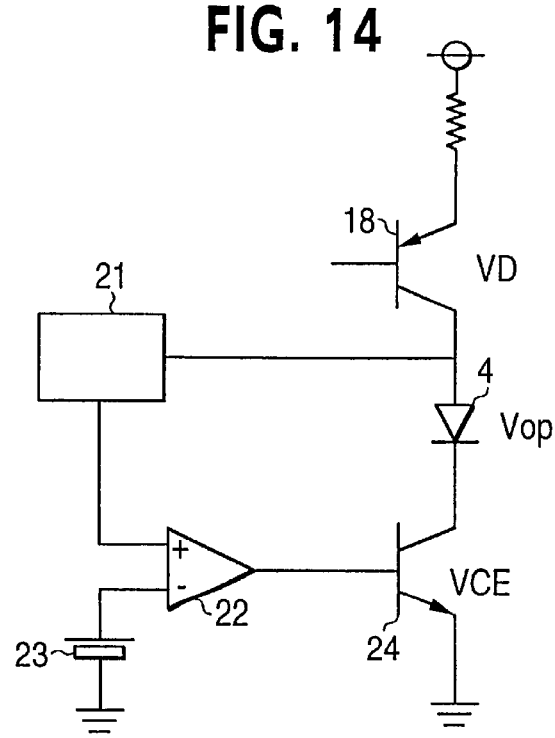
FIG. 14 is a circuit diagram of the power-saving SLD driving device.

FIG. 13 and FIG. 14 are circuit diagrams including a power saving function of the output section of the SLD driving device. FIG. 13 illustrates the SLD driving method shown in FIG. 9 where the driving current Iop is pulled out from the cathode side of SLD 4. Voltage detector 21 detects a collector voltage of transistor 18 in the output section of the SLD driving device.

Collector current of transistor 18 takes a pulse form at the recording mode, a dc form at the reproducing mode, and takes either one of the forms at the erasing mode. Therefore, an appropriate voltage detector 21 in this case is a gate type voltage detector, which synchronizes within the respective periods where peak power 2 at recording mode, bias power 1 at erasing mode and read power at reproducing mode run.

An output signal from voltage detector 21 is compared with a reference voltage source 23 in voltage comparator 22, and the result is fed back to transistor 24 of the power supply section. In this exemplary embodiment, the collector voltage of transistor 18 is always controlled at a constant level in the respective modes of recording, erasing and reproducing.

When the collector voltage of transistor 18 is set at a minimum operable value, i.e. a voltage minimized within a range free from being saturated with a bottom line, heating amount at the output section of the SLD driving device can be maintained at the minimum level. The above description is based on an assumption that the reference voltage source 23 is kept at a constant level; however, the source voltage 23 can be switched to an optimum value for the respective modes of recording, erasing and reproducing.

FIG. 14 illustrates an example of a power saving function included in the SLD driving method shown in FIG. 10 where the driving current Iop is poured into the anode side of SLD 4. As same as shown in FIG. 13, voltage detector 21 detects the collector voltage of driving transistor 18, and an output from detector 21 is compared with reference voltage source 23 in voltage comparator 22. The result is fed back to transistor 24 of the power supply section.

In FIG. 13, since an emitter voltage of transistor 24 in the power supply section is a DC source voltage of the optical disc apparatus, it naturally varies a little. However reference voltage source 23 comprises, for example a band-gap receiving little voltage changes, and the collector voltage of transistor 18 can be kept stable against the voltage variation.

A variation ΔPP in power consumption due to a voltage variation ΔVCE of the collector voltage VCE of transistor 24 is expressed by Expression 14 as follows:

$$\Delta PP = \Delta VCE \times Iop \qquad \text{Expression 14}$$

Transistor 24 in the power supply section is placed away from the optical pickup, e.g. placed at main section 19 as shown in FIG. 11. As a result, the heat source is set apart from the optical pickup at the main section to prevent variation of DC source voltage of the optical disc apparatus.

The VCC shown in Expression 9 is a collector voltage of transistor 24 in the power supply section, and the following expression is established when the collector voltage is denoted Vc.

$$P = Vc \times Iop \qquad \text{Expression 15}$$

On the other hand, Vc=Vop+Vd has been established, Expressions 16 and 17 as follows can be established.

$$P = (Vop + Vd) \times Iop \qquad \text{Expression 16}$$

$$= (Vld + Iop \times Rs + Vd) \times Iop \qquad \text{Expression 17}$$

Since Vop, Vld and Rs are proper values to SLD 4 and are not changed, the power consumption P of the optical pickup 3 is free from influence by the variations of the power source.

Further, the voltage of reference voltage source 23 is adjusted so that the voltage Vd across the output section of the SLD driving device becomes the minimum operable value, whereby the power consumption of the optical pickup can be reduced. This is proved by Expressions 16 and 17.

As such, the SLD driving device is placed on the pickup incorporating the SLD, and the voltage Vd across the output section of the SLD driving device is adjusted to a minimum operable value, so that the heating amount in the optical pickup can be minimized. As a result, driving the SLD with multiple values can be achieved in a stable and accurate manner with a high speed. In other words, recording and reproducing data at a higher speed can be realized.

What is claimed is:

1. An optical disc apparatus comprising:
   a semiconductor laser diode operable to generate a laser beam to record and reproduce data on an optical disc; and
   a driving device operable to drive said semiconductor laser diode, wherein a distance L between said driving device and said semiconductor laser diode is adjusted such that 5 cm>L>0, Ta<0.5× 0.5÷f, and Tb<0.5× 0.5÷f, wherein:
   f=a maximum frequency when the laser beam is optically modulated pulse-wise and f>0,
   Ta=a rising time of the optically modulated waveform, and Ta>0, and
   Tf=a falling time of the optically modulated waveform, and Tb>0.

2. An optical disc apparatus as claimed in claim 1, further comprising:
   a movable section, wherein said driving device is mounted to said moveable section; and
   an optical pickup mounted to said movable section.

3. An optical disc apparatus as claimed in claim 1, wherein said driving device comprises:
   a signal input section operable to receive a number N of laser power setting signals, wherein N is a natural number;
   a timing signal input section operable to receive the number N of switch timing signals for selecting a number P of the number N of laser power setting signals, wherein P is a natural number and P≦N;
   a signal adder for adding the number P of laser power setting signals selected in said timing signal input section; and an electric current source operable to supply a driving current to said semiconductor laser diode in response to the number P of laser power setting signals added by said signal adder.

4. An optical disc apparatus as claimed in claim 3, wherein said signal input section is operable to receive the number N of laser power setting signals as current signals.

5. An optical disc apparatus as claimed in claim 3, wherein said timing signal input section is operable to receive a number M of the number N of switch timing signals in differential form, wherein M is a natural number and $M \leq N$.

6. An optical disc apparatus as claimed in claim 3, further comprising a power supply section including a voltage controller, wherein said voltage controller is operable to compare a voltage across an output section of said driving device with a reference value and is further operable to control the voltage across said output section at a constant level.

7. An optical disc apparatus as claimed in claim 6, wherein said voltage controller is further operable to maintain the voltage across said output section of said driving device at a minimum value to operate said output section.

8. An optical disc apparatus as claimed in claim 6, further comprising:
a movable section;
a main section, wherein said power supply section is located at said main section; and
an optical pickup mounted to said movable section.

9. A method for driving a semiconductor laser diode device with a driving device in an optical disc apparatus, the semiconductor laser diode for generating a laser beam to record and reproduce data on an optical disc, said method comprising:
adjusting a distance L between the driving device and the semiconductor laser diode such that 5 cm>L>0, $Ta<0.5 \times 0.5 \div f$, and $Tb<0.5 \times 0.5 \div f$, wherein:
f=a maximum frequency when the laser beam is optically modulated pulse-wise and f>0,
Ta=a rising time of the optically modulated waveform and Ta>0, and
Tf=a falling time of the optically modulated waveform and Tb>0.

10. A method as claimed in claim 9, wherein the optical disc apparatus has a current driving section and an optical pickup mounted to a movable section of the optical disc apparatus.

11. A method as claimed in claim 10, further comprising:
inputting a number N of laser power setting signals, wherein N is a natural number;
selecting a number P of the number N of laser power setting signals based on the number N of switch timing signals, wherein P is a natural number and $P \leq N$;
adding the number P of laser power setting signals selected in said selecting operation; and
supplying a driving current to the semiconductor laser diode in response to the number P of laser power setting signals added by said adding operation.

12. A method as claimed in claim 11, wherein the number N of laser power setting signals are current signals.

13. A method as claimed in claim 11, wherein a number M of the number N of switch timing signals are transmitted as differential signals, wherein M is a natural number and $M \leq N$.

14. A method as claimed in claim 11, further comprising:
monitoring a voltage across an output section of the driving device; and
controlling a voltage on a power supply section operable to supply a current to the output section and the semiconductor laser diode so that the voltage of the output section is controlled to be a constant level.

15. A method as claimed in claim 14, wherein said controlling further comprises controlling a voltage supplied to the output section to be a minimum value for operating the output section.

16. A method as claimed in claim 14, wherein the optical disc apparatus has a moveable section where an optical pickup and the semiconductor laser diode are located and a main section where the power supply section is located.

* * * * *

UNITED STATES PATENT AND TRADEMARK OFFICE
CERTIFICATE OF CORRECTION

PATENT NO. : 6,339,579 B1 Page 1 of 1
APPLICATION NO. : 09/287338
DATED : January 15, 2002
INVENTOR(S) : Yuichi Kamioka et al.

It is certified that error appears in the above-identified patent and that said Letters Patent is hereby corrected as shown below:

In Column 8, line 48, claim 1, "Tf = a falling time of the optically modulated waveform, and Tb>0." should read, --Tb = a falling time of the optically modulated waveform, and Tb>0.--.

Signed and Sealed this

Sixteenth Day of December, 2008

JON W. DUDAS
*Director of the United States Patent and Trademark Office*